(12) United States Patent
Gscheidle et al.

(10) Patent No.: US 10,915,387 B2
(45) Date of Patent: Feb. 9, 2021

(54) CIRCUIT ASSEMBLY AND METHOD FOR MONITORING A MICRO-CONTROLLER BASED ON A WATCHDOG VOLTAGE

(71) Applicant: KNORR-BREMSE SYSTEME FUER NUTZFAHRZEUGE GMBH, Munich (DE)

(72) Inventors: Wolfgang Gscheidle, Oberstenfeld (DE); Thorsten Beyse, Dettingen (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 393 days.

(21) Appl. No.: 15/769,613

(22) PCT Filed: Oct. 18, 2016

(86) PCT No.: PCT/EP2016/074979
§ 371 (c)(1),
(2) Date: Apr. 19, 2018

(87) PCT Pub. No.: WO2017/067928
PCT Pub. Date: Apr. 27, 2017

(65) Prior Publication Data
US 2018/0314245 A1 Nov. 1, 2018

(30) Foreign Application Priority Data
Oct. 22, 2015 (DE) .......................... 10 2015 117 977

(51) Int. Cl.
*G06F 11/00* (2006.01)
*G06F 11/07* (2006.01)
(Continued)

(52) U.S. Cl.
CPC .... *G06F 11/0754* (2013.01); *G01R 31/31712* (2013.01); *G05B 23/0254* (2013.01); *G06F 11/0739* (2013.01); *G06F 11/0757* (2013.01)

(58) Field of Classification Search
CPC .... G06F 1/28; G06F 11/0739; G06F 11/0754; G06F 11/0757; G01R 31/3167; G01R 31/31712
See application file for complete search history.

(56) References Cited

U.S. PATENT DOCUMENTS 4,243,975 A 1/1981 Masuda et al.
4,586,179 A * 4/1986 Sirazi .................. G06F 11/1441
714/14
(Continued)

FOREIGN PATENT DOCUMENTS

CN 104054114 A 9/2014
CN 104330666 A 2/2015
(Continued)

OTHER PUBLICATIONS

International Search Report dated Oct. 2, 2017 of the corresponding International Application PCT/EP2016/074979 filed Oct. 18, 2016.

*Primary Examiner* — Michael Maskulinski
(74) *Attorney, Agent, or Firm* — Norton Rose Fulbright US LLP; Gerard Messina

(57) ABSTRACT

A circuit assembly for monitoring the timing behavior of a microcontroller, including: a microcontroller to drive at least one watchdog voltage generating section for a temporally defined generation of at least one monitoring voltage and to detect and read in the generated monitoring voltage at a predetermined sampling point in time; in which the at least one watchdog voltage generating section is arranged to generate the monitoring voltage that is detectable at a predetermined sampling point in time by sampling by the microcontroller, in which a monitoring voltage that is (Continued)

detected at the sampling point in time and lies within a predetermined voltage tolerance range indicates a fault-free microcontroller state, and a monitoring voltage that is detected at the predetermined point in time and lies outside the predetermined voltage tolerance range indicates a faulty microcontroller state. Also described is a related method.

20 Claims, 4 Drawing Sheets

(51) Int. Cl.
    *G01R 31/317*     (2006.01)
    *G05B 23/02*     (2006.01)

(56) References Cited

U.S. PATENT DOCUMENTS

| | | | |
|---|---|---|---|
| 5,677,838 A * | 10/1997 | Itou | B60R 21/0173 |
| | | | 180/271 |
| 6,463,546 B1 | 10/2002 | Jeske et al. | |
| 9,919,665 B2 * | 3/2018 | Karner | H03K 5/26 |
| 2002/0174160 A1 | 11/2002 | Gatto et al. | |
| 2010/0176891 A1 | 7/2010 | Tasher et al. | |
| 2010/0287398 A1 | 11/2010 | Froschhammer et al. | |

FOREIGN PATENT DOCUMENTS

| | | |
|---|---|---|
| CN | 104412710 A | 3/2015 |
| DE | 19731086 A1 | 1/1999 |
| DE | 102013226429 A1 | 6/2015 |
| RU | 2261470 C1 | 8/2005 |
| WO | 2009/040216 A2 | 4/2009 |

\* cited by examiner

CIRCUIT ASSEMBLY AND METHOD FOR MONITORING A MICRO-CONTROLLER BASED ON A WATCHDOG VOLTAGE

FIELD OF THE INVENTION

The invention relates to a circuit assembly, and relates in particular to a digital watchdog (WD) circuit for monitoring the temporal behavior or timing behavior of a microcontroller. Furthermore, the invention relates to a method for monitoring a microcontroller on the basis of a watchdog voltage generated by a watchdog circuit assembly.

Rising cost pressure in the development of electronic systems is increasingly bringing about a changeover in such systems from multi-computer systems used hitherto to single-computer systems. Owing to likewise rising demands for functional safety, for example in the field of vehicles, and in particular that of utility vehicles, the redundancy available hitherto in multi-computer systems must also be ensured or further improved in single-computer systems.

Watchdog circuits (WD) for the timing behavior of a microcontroller in the form of digital circuits and methods (such as, for example, a window WD, an intelligent WD based on question-answer sequences and the like) are known per se. Likewise known per se is a fixed static reference voltage at an input terminal or PIN of an analog-to-digital converter (ADC) at a microcontroller that is intended to ensure the correct function of the ADC.

There is a need for a circuit assembly which is cost-effective and at the same time simple to produce and which allows simple but effective checking of the temporal behavior of a microcontroller.

SUMMARY OF THE INVENTION

Therefore, the invention is based on an object of providing, for a single-computer system comprising a microcontroller, a circuit assembly and a method for monitoring same by which analog (ADC) inputs of the microcontroller can be checked for a correct function and as far as possible at the same time the microcontroller itself can also be checked for correct internal timing.

This object is achieved according to the invention by a watchdog circuit assembly having the features described herein and by a method for monitoring a microcontroller on the basis of a watchdog voltage having the features described herein. The subject matter described herein relates to advantageous developments of the invention.

The invention is based on the general concept of providing a cost-effective and at the same time simple circuit assembly which allows simple but effective checking of the timing or temporal behavior of a microcontroller. The two requirements for checking the function of an analog-to-digital converter and for correct timing of the microcontroller (µC) are combined according to the invention. In exemplary embodiments described below, the circuit requires only three to five cost-effective standard components. A necessary independent reference voltage can optionally also be made available by some other circuit part, such that no additional components are required for this purpose.

More precisely, using a highly stable reference voltage, the value of which is known precisely, and known tolerances of components used which define an allowed or permissible range for a voltage detection value, a capacitor is firstly completely discharged and then charged again beginning at a specific point in time along a charging curve determined by a timer. Starting from said specific point in time, the charging time up to a specific voltage, in the present case the monitoring voltage to be detected, which the microcontroller will read in after this time, is known precisely. The charging time is exactly predefined by the microcontroller and is thus an absolute measure of the voltage to be read back. By virtue of the strict dependence of the charging time and the value of the monitoring voltage, the absolute charging time directly concomitantly influences the result. If said absolute charging time changes for example as a result of a deviating timing or a malfunction within the microcontroller, the monitoring voltage changes proportionally thereto. If the monitoring voltage in this case leaves the tolerance band determined by the component tolerances, it is possible unambiguously to identify these faults in the microcontroller and to bring the overall system into a safety-noncritical operating state.

In accordance with the text above, the object is achieved in specific detail by a watchdog circuit assembly for monitoring the timing behavior of a microcontroller. The watchdog circuit assembly comprises a microcontroller arranged to drive at least one watchdog voltage generating section for the temporally defined generation of at least one monitoring voltage and to detect and read in the then generated monitoring voltage at a predetermined sampling point in time, and the at least one watchdog voltage generating section arranged to generate the monitoring voltage that is detectable at a predetermined sampling point in time by sampling by the microcontroller, wherein a monitoring voltage that is detected at the sampling point in time and lies within a predetermined voltage tolerance range indicates a fault-free state of the microcontroller, and a monitoring voltage that is detected at the predetermined point in time and lies outside the predetermined voltage tolerance range indicates a faulty state of the microcontroller.

The watchdog voltage generating section may comprise at least one capacitor, at which the monitoring voltage is provided. Since the voltage profile of a charging curve at a capacitor in the case of components whose parameters are known is likewise known, a simple voltage sampling can advantageously be produced.

The watchdog voltage generating section may comprise at least one transistor, which is interconnected in parallel with the capacitor and is switchable in a time-controlled manner by the microcontroller depending on a logic state at an output of the microcontroller, wherein, during a state of logic 0 of the output, the transistor is turned off and the capacitor is chargeable in a defined manner, and, during a state of logic 1 of the output, the transistor is turned on and the capacitor is dischargeable in a defined manner. In the underlying voltage and/or power range, a transistor as switching element is an advantageously cost-effective possibility for controlling the charging and/or the discharging of a capacitor.

The capacitor may be arranged to be completely discharged at an arbitrary point in time, and to be charged from the discharged state at a predetermined point in time, via the transistor in a manner controlled by the microcontroller, wherein the capacitor voltage and, at a subsequent sampling point in time, the monitoring voltage arise at the capacitor in accordance with the following equation defining a charging curve: $U(c/\frac{1}{2})=U_{Ref}*(1-\exp(-t_{charge}/R*C)$ wherein Uc or U1 and/or U2 is the monitoring voltage that the microcontroller will read in at the sampling point in time after a known charging time starting from the predetermined point in time, $U_{Ref}$ is a highly stable reference voltage, the value of which is known precisely and which from an independent voltage regulating element, e.g. a reference diode, may be independent of the supply voltage of the µC, $t_{charge}$ is the known charging time, and R/C defines an RC element comprising a resistor and the capacitor, which RC element defines a time constant τ=R*C with which the capacitor is charged. Advantageously, the parameters and signal profiles to be taken as a basis are thus exactly determinable and calculable.

The first resistor may be interconnected in series with the capacitor and is connected to a reference voltage at a first of its ends and is connected to a first terminal of the capacitor at a second of its ends; a supply resistor is provided, which is connected to a supply voltage at a first of its ends and is connected to a diode cathodally at a second of its ends, which diode provides the reference voltage between the first end of the first resistor and a second terminal of the capacitor; and the transistor comprises a first terminal, which is connected to the first terminal of the capacitor and an analog converter input of the microcontroller, a second terminal, which is connected to an output of the microcontroller, and a third terminal, which is connected to the second terminal of the capacitor, anodally to the diode and to a ground potential.

Alternatively, provision may be made of a first watchdog voltage generating section, in which a first first resistor is interconnected in series with a first capacitor and is connected to a reference voltage at a first of its ends and is connected to a first terminal of the first capacitor at a second of its ends; a supply resistor is provided, which is connected to a supply voltage at a first of its ends and is connected to a diode cathodally at a second of its ends, which diode provides the reference voltage between the first end of the first first resistor and a second terminal of the first capacitor; and a first transistor comprises a first terminal, which is connected to the first terminal of the first capacitor and a first analog converter input of the microcontroller, a second terminal, which is connected to a first output of the microcontroller, and a third terminal, which is connected to the second terminal of the first capacitor, anodally to the diode and to a ground potential; and a second watchdog voltage generating section is provided, in which a second first resistor is interconnected in series with a second capacitor and is connected to a reference voltage at a first of its ends and is connected to a first terminal of the second capacitor at a second of its ends; the supply resistor is provided, which is connected to a supply voltage at a first of its ends and is connected to a diode cathodally at a second of its ends, which diode provides the reference voltage between the first end of the first first resistor and the first end of the second first resistor and a second terminal of the first capacitor and of the second capacitor; and the second transistor comprises a first terminal, which is connected to the first terminal of the second capacitor and a second analog converter input of the microcontroller, a second terminal, which is connected to a second output of the microcontroller, and a third terminal, which is connected to the second terminal of the second capacitor and to a ground potential, wherein the first watchdog voltage generating section and the second watchdog voltage generating section form a multi-channel watchdog circuit assembly.

The first watchdog voltage generating section and the second watchdog voltage generating section may be driven and sampled in a time-shifted and/or phase-shifted manner such that one of the monitoring voltages is detected at one of the capacitors at a first predetermined time and is read in by the microcontroller, and another of the monitoring voltages is detected at another of the capacitors at a second predetermined time and is read in by the microcontroller. Advantageously, this enables a more extensive identification of individual faults at the watchdog circuit, for example if the microcontroller has sporadic clock dropouts or a defect of the drive port DO_1 for the discharging transistor T1. As a result of the defect, C1 would remain discharged, which would not be identified if the µC then continued to run again from this state. However, C2 would be charged further as a result of the dropout of the µC and would thus fall outside the tolerance window; the fault would thus be identifiable by the second channel.

The time constant of the timer determined by the first first resistor and the first capacitor and the time constant of the timer determined by the second first resistor and the second capacitor may differ from one another. Advantageously, so-called common-mode interference can thereby be differentiated better.

Samplings of the charging curve of the capacitor may be repeated cyclically at defined sampling times. A cyclic sampling ensures a continuous monitoring of the microcontroller during the ongoing operation thereof.

The microcontroller may be arranged to turn off the transistor until the complete charging of the capacitor, then to detect the absolute value of the reference voltage, and to calibrate at least one analog-to-digital converter channel of the microcontroller on the basis of the detected value of the reference voltage. Advantageously, the detection accuracy of the analog-to-digital converter can thereby be increased further.

The electronic switch may be embodied as a transistor. Further, the electronic switch may be embodied in a manner integrated into the microcontroller. Alternatively, the electronic switch may be provided in a manner situated outside the microcontroller and is connected thereto.

The object is likewise achieved by a method for monitoring a microcontroller on the basis of a voltage for monitoring the timing behavior of a microcontroller, said voltage being generated in a watchdog circuit assembly as described herein, comprising the following steps: driving at least one watchdog voltage generating section for the temporally defined generation of at least one monitoring voltage, wherein the driving comprises a defined discharging of a capacitor and then, beginning at a predetermined point in time, defined charging of the capacitor along a charging curve; and detecting and reading in the charging voltage of the capacitor, said charging voltage being generated at a predetermined sampling point in time, as the monitoring voltage, wherein a monitoring voltage that is detected at the sampling point in time and lies within a predetermined voltage tolerance range indicates a fault-free state of the microcontroller, and a monitoring voltage that is detected at the predetermined point in time and lies outside the predetermined voltage tolerance range indicates a faulty state of the microcontroller.

During a state of logic 0 of an output of the microcontroller, a transistor may be turned off and the capacitor is chargeable in a defined manner, and, during a state of logic 1 of the output, the transistor is turned on and the capacitor is dischargeable in a defined manner.

The capacitor may be completely discharged at an arbitrary point in time, and is charged from the discharged state at a predetermined point in time, via the transistor in a manner controlled by the microcontroller, wherein the capacitor voltage and, at a subsequent sampling point in time, the monitoring voltage arise at the capacitor in accordance with the following equation defining a charging curve: $U(c/\frac{1}{2}) = URef*(1-\exp(-t_{charge}/R*C))$ wherein Uc or U1 and/ or U2 is the monitoring voltage that the microcontroller will read in at the sampling point in time after a known charging time starting from the predetermined point in time, $U_{Ref}$ is a highly stable reference voltage, the value of which is known precisely, $t_{charge}$ is the known charging time, and R/C defines an RC element comprising a resistor and the capacitor, which RC element defines a time constant $\tau=R*C$ with which the capacitor is charged.

A first watchdog voltage generating section and a second watchdog voltage generating section may be driven and sampled in a phase-shifted manner such that one of the monitoring voltages is detected at one of the capacitors at a first predetermined time and is read in by the microcontroller, and another of the monitoring voltages is detected at another of the capacitors at a second predetermined time and is read in by the microcontroller.

A time constant of an RC timer of a first watchdog voltage generating section and a time constant of an RC timer of a second watchdog voltage generating section may differ from one another.

Samplings of the charging curve of the capacitor may be repeated cyclically at defined sampling times.

The transistor may be turned off until complete charging of the capacitor, then the absolute value of the reference voltage is detected, and at least one analog-to-digital converter channel of the microcontroller is calibrated on the basis of the detected value of the reference voltage.

The invention is described in greater detail below on the basis of the exemplary embodiments with reference to the drawings.

It is noted that, in the drawing, corresponding or identically acting elements may bear the same or at least similar reference signs and in this case are respectively not described again.

DETAILED DESCRIPTION

Figure 1:
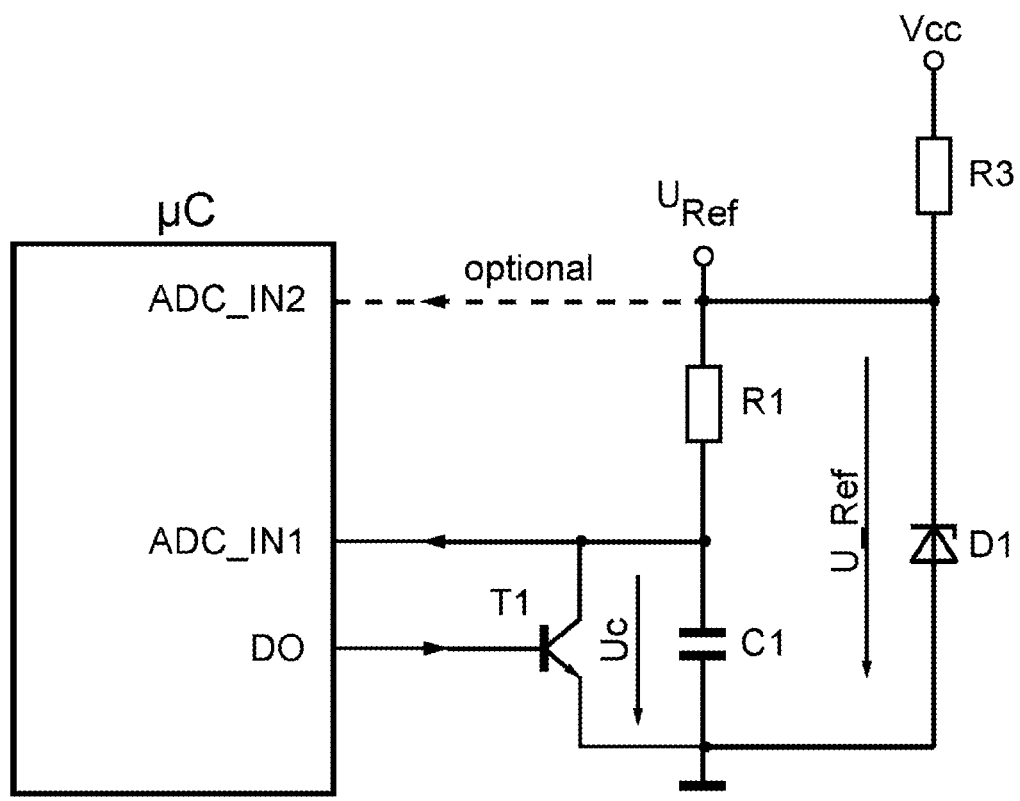
FIG. 1 shows a simplified basic illustration, as an excerpt, of a watchdog circuit assembly for monitoring the temporal behavior or timing behavior of a microcontroller in accordance with a first exemplary embodiment.

FIG. 1 shows a simplified basic illustration, as an excerpt, of a watchdog circuit assembly for monitoring the temporal behavior or timing behavior of a microcontroller µC in accordance with a first exemplary embodiment.

In this exemplary embodiment, the microcontroller µC, shown on the left-hand side in FIG. 1, is a control device usable in, for example, systems, electronic control units (ECU) and the like for vehicles, in particular utility vehicles, and is well known as such. In accordance with this exemplary embodiment, the microcontroller µC comprises, alongside inputs and outputs or ports that are usually present, at least one first analog-to-digital converter input ADC_IN1 and a digital output DO. It goes without saying that further inputs, for example a second analog-to-digital converter input ADC_IN2 can be provided.

FIG. 1 illustrates on the right-hand side a watchdog voltage generating section, which is connected at least to the abovementioned first analog-to-digital converter input ADC_IN1 and the output DO and comprises at least a transistor T1, a capacitor C1, a resistor R1, a diode D1 and a resistor R3. A connection of the watchdog voltage generating section to the second analog-to-digital converter input ADC_IN2 may be optional, as will be described below.

In specific detail, according to FIG. 1, a first terminal of the transistor T1, for example the drain or collector terminal, is connected to the first input ADC_IN1 of the microcontroller µC, and a second terminal of the transistor T1, for example the gate or base terminal, is connected to the digital output DO. Furthermore, the first terminal of the transistor T1 is connected to a second end of the resistor R1 and a first terminal of the capacitor C1. A second end of the resistor R1 is connected to a reference voltage $U_{Ref}$ which is provided via the diode D1, for example a suitable zener diode. For this purpose, the diode D1 is connected in parallel with the series circuit comprising the resistor R1 and the capacitor C1 and is supplied by the resistor R3 e.g. from a supply voltage Vcc of, for example, 5 V of an electronic control unit (ECU), in which both the microcontroller µC and the watchdog voltage generating section are arranged or integrated. A third terminal of the transistor T1 (source or emitter), a second terminal of the capacitor C1 and the anode side of the diode D1 are connected to a ground potential at a common node.

In the assembly mentioned above, the transistor T1, which in this configuration forms a discharging transistor for the capacitor C1, is thus connected in parallel with the capacitor C1, and the series circuit comprising the resistor R1 and the capacitor C1, which series circuit in this configuration forms an RC element R1/C1, is connected in parallel with the diode D1.

In a modification of the present exemplary embodiment and as a variant of a microcontroller port, the transistor T1 described above, which in the configuration described operates as a discharging transistor for the capacitor C1, can also already be integrated in the microcontroller µC. In this case, the capacitor C1 can be directly connected to the corresponding input and output ports of the microcontroller µC.

The voltage ($U_{Ref}$) across the diode, which is supplied via the resistor R3 connected e.g. to the supply voltage Vcc, may be a highly precise reference voltage, the value of which is known precisely and which is independent of other supply voltages.

The transistor T1 is driven by a digital input/output port of the microcontroller the digital output DO in this exemplary embodiment. As long as the port DO is logic 0, the transistor T1 is turned off, and the capacitor C1 is charged to the voltage $U_{Ref}$ with the time constant $\tau=R1*C1$. The dimensioning or the values of the resistor R1, of the capacitor C1 and of the transistor T1 are known precisely, as are tolerances of these respective components. Consequently, the charging time constant is also known. Tolerance limits, which are yet to be described and in this exemplary embodiment are designated by $U_{min}$ (lower tolerance limit) and $U_{max}$ (upper tolerance limit) and as such represent a tolerance band, can be calculated by a person skilled in the art.

As has been described above, the microcontroller µC is arranged to drive, i.e. to turn off or to turn on, the transistor T1 via the digital output DO. Therefore, the microcontroller µC can completely charge the capacitor C1 at an arbitrary point in time by turning off the transistor T1 and afterward, for example at a predetermined point in time t0, can discharge said capacitor again by enabling the transistor T1, i.e. switching the latter to the on state. In other words, the capacitor C1 can be charged again starting from the predetermined point in time t0.

The charging curve of the capacitor C1 follows the general equation $U=URef*(1-\exp(-t/R*C))$. With a predetermined charging time $t_{charge}$, which can be exactly predefined by the microcontroller μC and which is an absolute measure of the voltage to be read back by the microcontroller μC, the capacitor voltage thus results from the equation $Uc=URef*(1-\exp(-t_{charge}/R1*C1))$ at a sampling point in time after the charging time $t_{charge}$ has elapsed. In other words, therefore, starting from the point in time t0, the charging time up to a voltage Uc that the microcontroller μC will read in after the charging time has elapsed is known precisely. On account of the abovementioned tolerances of the components, in this case a certain tolerance band around the voltage Uc, within which the voltage Uc can fluctuate even given a known charging time and known values of components involved, should be taken into account during the monitoring of the voltage Uc.

Figure 2A:
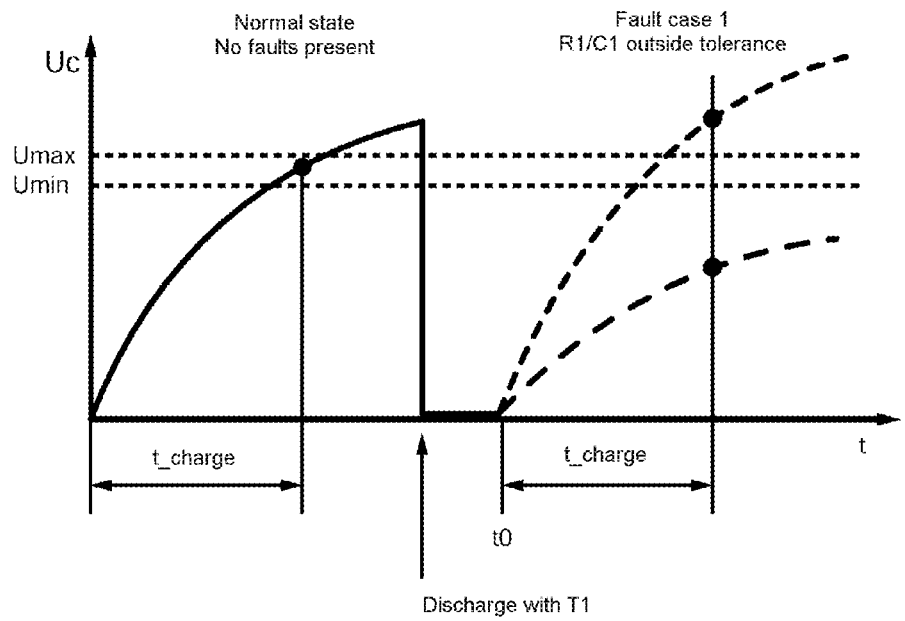
FIGS. 2A and 2B show, as excerpts, typical signal profiles in the form of voltage profiles for different operating states in the watchdog circuit assembly according to FIG. 1.
Figure 2B:
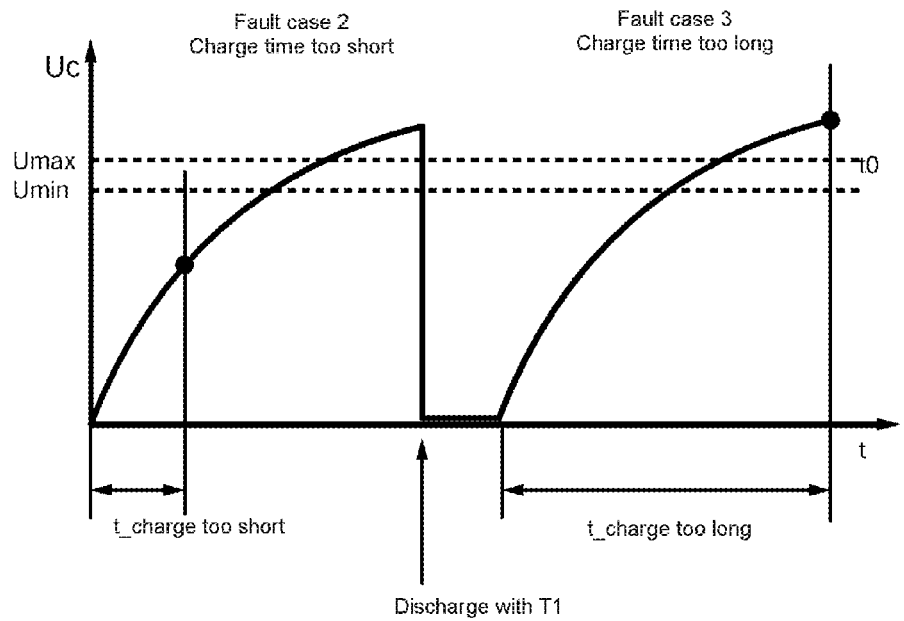

FIG. 2A and FIG. 2B show, as excerpts, typical signal profiles in the form of voltage profiles for different operating states in the watchdog circuit assembly according to FIG. 1.

In FIGS. 2A and 2B, in each case the capacitor voltage Uc present at the capacitor C1 is plotted along the ordinate and time is plotted along the abscissa. In this respect, FIGS. 2A and 2B thus show a charging voltage curve of the capacitor C1 against time. Horizontal broken lines designated by $U_{max}$ and $U_{min}$ on the ordinate respectively represent an upper and a lower tolerance limit and overall a tolerance band determined by tolerances of the components used as a permissible range in which, at a sampling point in time, the capacitor or monitoring voltage Uc is permitted to lie for a detection of a normal state, in which it is determined that no fault or no malfunction is present.

The charging curves illustrated in FIGS. 2A and 2B show, as excerpts from cyclic repetitions of charging and discharging processes, in specific detail the beginning of a charging of the capacitor C1 at a point in time which in FIGS. 2A and 2B lies for example at the origin (0, 0) of the coordinate system. After the beginning of the charging process, the monitoring voltage Uc in the equation above correspondingly rises. After a time t_charge has elapsed, at the sampling point then attained, the monitoring voltage Uc attained is sampled and read in or read back by the microcontroller μC.

The right-hand part of FIG. 2A refers to a fault case 1, in which, although the charging time t_charge is correct, for example values and/or parameters of the timer R1/C1 lie outside permissible tolerances. Upon the detection of a capacitor or monitoring voltage Uc lying outside the tolerance band at the sampling point in time, i.e. a capacitor or monitoring voltage Uc smaller than the lower tolerance limit $U_{min}$ (the capacitor or monitoring voltage Uc rises too slowly relative to the normal state) or larger than the upper tolerance limit $U_{max}$ (the capacitor or monitoring voltage Uc rises too rapidly relative to the normal state), fault case 1 is detected.

The left-hand part of FIG. 2B refers to a fault case 2, in which the charging time t_charge is too short, and the right-hand part of FIG. 2B refers to a fault case 3, in which the charging time t_charge is too long. On account of the excessively short charging time up to the sampling point in time, the monitoring voltage Uc does not reach the tolerance band, and fault case 2 is detected. On account of the excessively long charging time up to the sampling point in time, the monitoring voltage Uc exceeds the tolerance band, and fault case 3 is detected.

The length of time after the sampling point for which the capacitor C1 can or is intended to still charge further and the time for which the capacitor C1 then remains discharged can be chosen arbitrarily and do not influence the voltage measurement. During the time period of the further charging of the capacitor C1 after the sampling point, at a selectable point in time the microcontroller μC completely discharges the capacitor C1 by turning on the transistor T1. After the complete discharge of the capacitor C1, the microcontroller by turning off the transistor T1 at a point in time to, begins renewed charging of the capacitor C1 from the completely discharged state thereof.

As illustrated in FIGS. 2A and 2B, on account of the strict mutual dependence of the charge time or charging time t_charge, and the value of the monitoring voltage Uc, the absolute charge time also directly influences the result. In other words, if the charging time t_charge changes as a result of, for example, a deviating timing or a malfunction within the microcontroller μC, the voltage Uc changes proportionally thereto and may finally leave the tolerance band. As a result, such faults can be unambiguously identified in the microcontroller μC and the overall system can thereupon be brought to a safety-noncritical operating state.

In one modification, the absolute value of the reference voltage $U_{Ref}$ can optionally be determined by the microcontroller μC turning off the transistor T1 on a test basis until the capacitor C1 has been completely charged to the reference voltage $U_{Ref}$ (in this exemplary embodiment for example after a time $t=5*R1*C1$). As a result, it is possible, for example, to calibrate all present analog-to-digital converter channels of the microcontroller μC with the aid of the reference voltage and to further increase the detection accuracy of the analog-to-digital converter.

In a further modification, the microcontroller μC can also carry out a fault differentiation by multiple sampling of the charging curve of the capacitor C1 at defined sampling times. By way of example, if two successive samplings of the monitoring voltage Uc yield a constant value on account of, for instance, a short circuit and/or shunt to a different potential of a printed circuit board, it is possible to detect that the charging of the capacitor C1 must have been disturbed. It is noted that the invention is not restricted to the above modifications, rather a diagnosis depth can be extended and/or improved in virtually any desired way.

Figure 3:
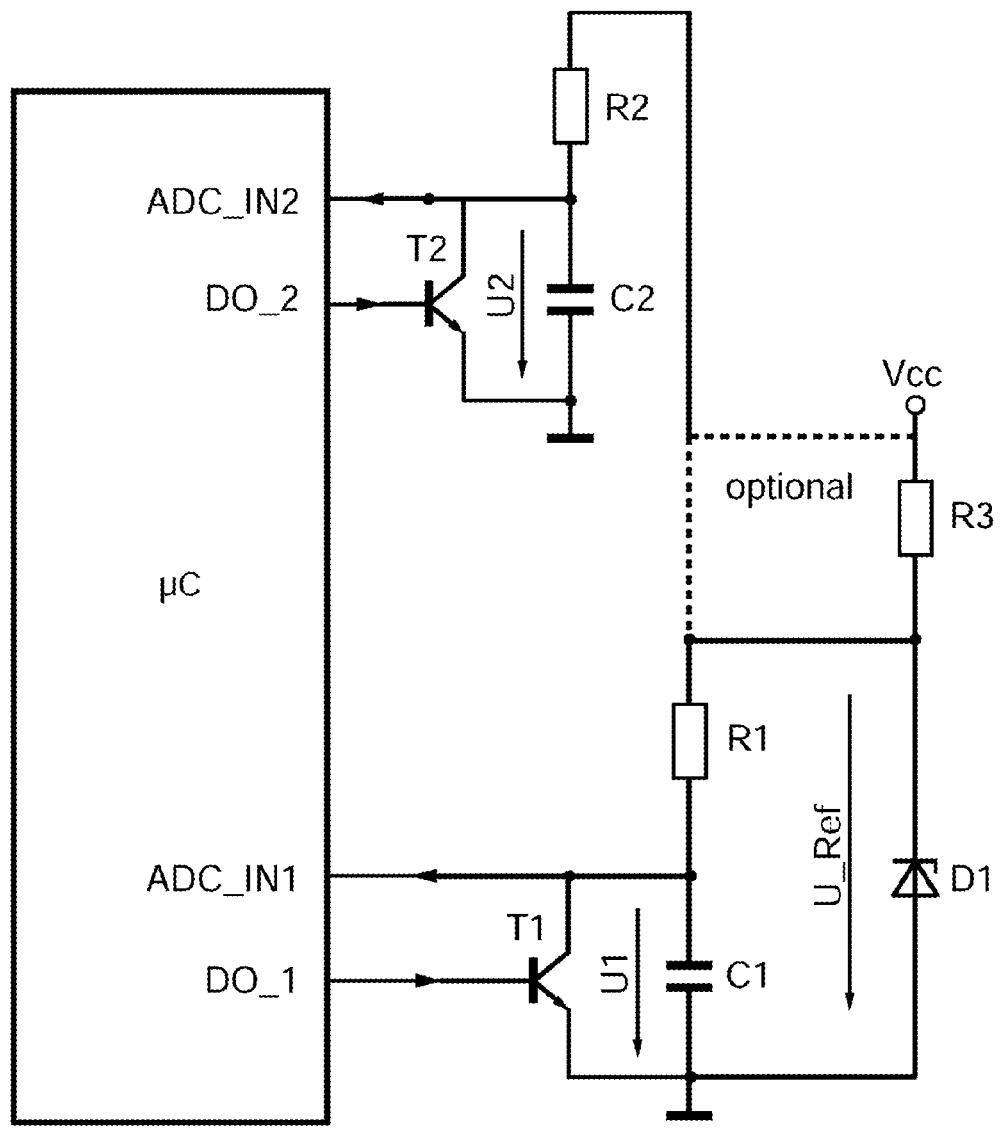
FIG. 3 shows a simplified basic illustration, as an excerpt, of a watchdog circuit assembly for monitoring the temporal behavior or timing behavior of a microcontroller in accordance with a second exemplary embodiment.

FIG. 3 shows a simplified basic illustration, as an excerpt, of a watchdog circuit assembly for monitoring the temporal behavior or timing behavior of a microcontroller in accordance with a second exemplary embodiment.

The circuit assembly illustrated in FIG. 3 is improved by comparison with the configuration shown in FIG. 1 by a doubling of circuit parts, and therefore comprises a (multi-channel) microcontroller μC of a type known per se having, besides inputs and outputs or ports that are usually present, at least a first analog-to-digital converter input ADC_IN1, a second analog-to-digital converter input ADC_IN2, a first digital output DO_1 and a second digital output DO_2.

FIG. 3 illustrates on the right-hand side a first and a second watchdog voltage generating section, which are connected at least to the first analog-to-digital converter input ADC_IN1 and the first output DO_1 and, respectively, the second analog-to-digital converter input ADC_IN2 and the second output DO_2 and comprise at least a first transistor T1 and, respectively, a second transistor T2, a first capacitor C1 and, respectively, a second capacitor C2, a first first resistor R1 and, respectively, a second first resistor R2, a diode D1 and a resistor R3. A connection of the second watchdog voltage generating section to the supply voltage Vcc and/or the reference voltage $U_{Ref}$ may be optional, as will be described below.

Fundamentally, therefore, the first and second watchdog voltage generating sections are constructed in a similar fashion or identically. In specific detail, according to FIG. 3, a first terminal of the transistor T1, for example the drain or collector terminal, is connected to the first input ADC_IN1 of the microcontroller and a second terminal of the transistor T1, for example the gate or base terminal, is connected to the digital output DO_1. Furthermore, the first terminal of the transistor T1 is connected to a second end of the first first resistor R1 and a first terminal of the first capacitor C1. A second end of the first first resistor R1 is connected to a reference voltage $U_{Ref}$, which is provided via the diode D1, for example a suitable zener diode. For this purpose, the diode D1 is connected in parallel with the series circuit comprising the first first resistor R1 and the first capacitor C1 and is supplied by the resistor R3 from a supply voltage Vcc of, for example, 5 V of an electronic control unit (ECU), in which both the microcontroller μC and the watchdog voltage generating sections are arranged or integrated. A third terminal of the first transistor T1 (source or emitter), a second terminal of the first capacitor C1 and the anode side of the diode D1 are connected to a ground potential at a common node. Moreover, a first terminal of the second transistor T2, for example the drain or collector terminal, is connected to the second input ADC_IN2 of the microcontroller and a second terminal of the second transistor T2, for example the gate or base terminal, is connected to the second digital output DO_2 of the microcontroller μC. Furthermore, the first terminal of the second transistor T2 is connected to a second end of the second first resistor R2 and a first terminal of the second capacitor C2. A second end of the second first resistor R2 can be connected to a reference voltage $U_{Ref}$, which is provided via the diode D1, for example a suitable zener diode, or to the supply voltage Vcc. In order to provide the reference voltage $U_{Ref}$, the diode D1 is connected in parallel with the series circuit comprising the second first resistor R2 and the second capacitor C2 and is supplied by the resistor R3 from the supply voltage Vcc of, for example, 5 V of the electronic control unit (ECU), in which both the microcontroller μC and the watchdog voltage generating sections are arranged or integrated. A third terminal of the second transistor T2 (source or emitter), a second terminal of the second capacitor C2 and the anode side of the diode D1 can be connected to a ground potential at a common node.

Here, too, in a modification of the present exemplary embodiment and as a variant of a microcontroller port, the transistors T1 and/or T2 described above, which in the described configuration operate as discharging transistors for the capacitor C1 and C2, respectively, can also already be integrated in the microcontroller μC. In this case, the capacitors C1 and/or C2 can be directly connected to the corresponding input and output ports of the microcontroller μC.

Moreover, there is no limitation with regard to an underlying reference potential. Although, as described above and shown in FIG. 1 and FIG. 3, a ground potential or GND (ground) can form such a reference potential, the reference potential can be chosen arbitrarily in accordance with or appropriately for a detection range of the analog-to-digital converter input of the microcontroller μC. By way of example, by comparison with the configuration shown in FIG. 1 and FIG. 3, at least one of the transistors T1, T2 can be arranged in an inverted manner and in this case, instead of the ground potential, the supply voltage Vcc can also be used as reference potential.

In the assembly mentioned above, therefore, the first transistor T1, which in this configuration forms a discharging transistor for the first capacitor C1, is connected in parallel with the first capacitor C1, and the series circuit comprising the first first resistor R1 and the first capacitor C1, which series circuit in this configuration forms an RC element R1/C1, is connected in parallel with the diode D1. Moreover, the second transistor T2, which in this configuration forms a discharging transistor for the second capacitor C2, is connected in parallel with the second capacitor C2, and the series circuit comprising the second first resistor R2 and the second capacitor C2, which series circuit in this configuration forms an RC element R2/C2, is connected in parallel with the diode D1.

In this configuration, therefore, as an improvement by comparison with the exemplary embodiment shown in FIG. 1, by a doubling of circuit parts and/or circuitry arrangements, a plurality of redundant channels are formed, to each of which the voltage generating, charging and discharging conditions, drivings of components and tolerance considerations as described above with reference to FIG. 1 are applicable. To avoid redundancy in the description, therefore, these will not be described again.

By comparison with the first exemplary embodiment, in the second exemplary embodiment, both watchdog voltage generating sections may be sampled and driven in a phase-shifted or temporally shifted manner such that a first pin of the microcontroller μC samples the voltage at the capacitor C1 after a time t1, for example, while a second pin of the microcontroller samples the voltage at the capacitor C2 after a time $t2=t1+\Delta t$ or t_delta. In this case, it is possible to choose the sampled value after t2 for example after 70% of the time t_charge and with a sufficient temporal spacing with respect to t1.

In one modification, at the same time or alternatively, the time constants of the timers R1/C1 and R2/C2 are configured differently ($R1*C1 \neq R2*C2$). As a result, it is possible to better differentiate asymmetrical interference such as common-mode interference.

In accordance with a second exemplary embodiment, a more extensive identification of individual faults at the watchdog circuit assembly is advantageously possible. By way of example, the microcontroller μC may exhibit sporadic clock dropouts or a defective drive port DO_1 for the discharging transistor T1. As a result, the first capacitor C1 would remain discharged in this case. This would not be able to be correctly detected if a microcontroller μC of single-channel configuration continued to operate in this state. Since in the case of a multi-channel configuration, however, the second capacitor C2 is nevertheless charged further and thus passes outside the tolerance band, a fault of the above-mentioned type is identifiable by evaluation of the second channel as well.

Figure 4:
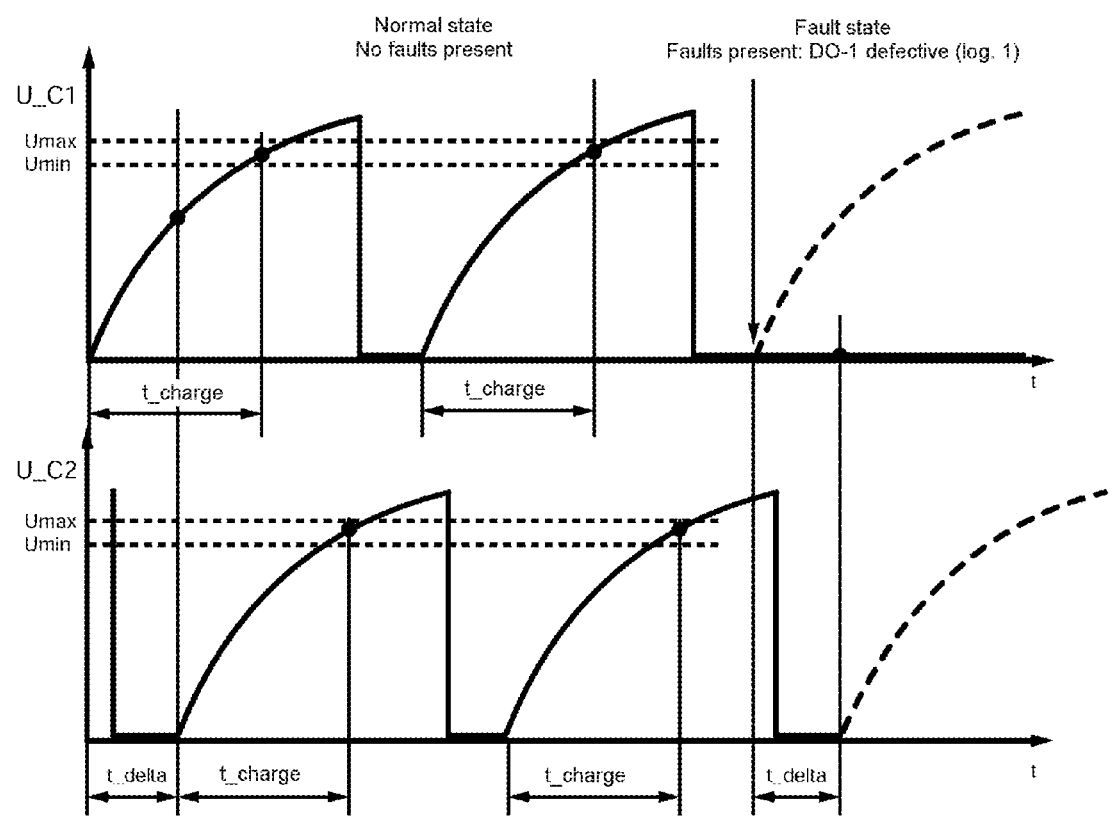
FIG. 4 shows, as excerpts, typical signal profiles in the form of voltage profiles, in particular in the case of a fault with redundant channels, for different operating states in the watchdog circuit assembly according to FIG. 3.

FIG. 4 shows, as an excerpt, typical signal profiles in the form of voltage profiles U_C1, U_C2, in particular in a fault case with redundant channels, for different operating states in the watchdog circuit assembly according to FIG. 3. Specifically, FIG. 4 illustrates the abovementioned fault state of a defective output DO_1 (for example permanently at logic 1) of the microcontroller μC and the sampling—temporally shifted by t_delta—of the individual channels configured with the first and second watchdog voltage generating sections. For the rest, as can readily be inferred from the drawing, the manner of consideration in FIG. 4 corresponds to that in FIG. 2A and/or 2B, and will not be described again in this respect, in order to avoid redundant content in the description.

It goes without saying that the invention is not restricted to the exemplary embodiments specifically described above, rather that modifications resulting in equivalent, comparable or similar configurations are readily evident to the person skilled in the art and should therefore not be regarded as deviation from the subject matter of the invention as defined hereinafter.

THE LIST OF REFERENCE SIGNS IS AS FOLLOWS

μC Microcontroller
C1 First capacitor
C2 Second capacitor
T1 First transistor
T2 Second transistor
R1 First/first first resistor
R2 Second first resistor
R3 Second resistor or supply resistor
D1 Diode
Vcc Supply voltage
$U_{Ref}$ Reference voltage
Uc, U_C1, U_C2 Monitoring voltages

The invention claimed is:

1. A circuit assembly for monitoring a timing behavior of a microcontroller, comprising:
a microcontroller arranged to drive at least one watchdog voltage generating section for a temporally defined generation of at least one monitoring voltage and to detect and read in the then generated monitoring voltage at a predetermined sampling point in time;
wherein the at least one watchdog voltage generating section is arranged to generate the monitoring voltage that is detectable at a predetermined sampling point in time by sampling by the microcontroller, wherein a monitoring voltage that is detected at the sampling point in time and lies within a predetermined voltage tolerance range indicates a fault-free state of the microcontroller, and a monitoring voltage that is detected at the predetermined point in time and lies outside the predetermined voltage tolerance range indicates a faulty state of the microcontroller.

2. The circuit assembly of claim 1, wherein the watchdog voltage generating section includes at least one capacitor, at which the monitoring voltage is provided.

3. The circuit assembly of claim 2, wherein the watchdog voltage generating section includes at least one electronic switch, which is interconnected in parallel with the capacitor and is switchable in a time-controlled manner by the microcontroller depending on a logic state at an output of the microcontroller, wherein, during a state of logic 0 of the output, the electronic switch is turned off and the capacitor is chargeable in a defined manner, and, during a state of logic 1 of the output, the electronic switch is turned on and the capacitor is dischargeable in a defined manner.

4. The circuit assembly of claim 3, wherein the capacitor is arranged to be completely discharged at an arbitrary point in time, and to be charged from the discharged state at a predetermined point in time, via the electronic switch in a manner controlled by the microcontroller, wherein a capacitor voltage and, at a subsequent sampling point in time, the monitoring voltage arise at the capacitor in accordance with the following equation defining a charging curve:

$$U(c/\frac{1}{2})=U_{Ref}*(1-\exp(-t_{charge}/R*C)$$

wherein Uc or U1 and/or U2 is the monitoring voltage that the microcontroller will read in at the sampling point in time after a known charging time starting from the predetermined point in time, URef is a highly stable reference voltage, the value of which is known precisely, $t_{charge}$ is the known charging time, and R/C defines an RC element comprising a resistor and the capacitor, which RC element defines a time constant $\tau=R*C$ with which the capacitor is charged.

5. The circuit assembly of claim 4, wherein a first resistor is interconnected in series with the capacitor and is connected to a reference voltage at a first of its ends and is connected to a first terminal of the capacitor at a second of its ends, further comprising:
a supply resistor, which is connected to a supply voltage at a first of its ends and is connected to a diode cathodally at a second of its ends, which diode provides the reference voltage between the first end of the first resistor and a second terminal of the capacitor;
wherein the electronic switch includes a first terminal, which is connected to the first terminal of the capacitor and an analog converter input of the microcontroller, a second terminal, which is connected to an output of the microcontroller, and a third terminal, which is connected to the second terminal of the capacitor, anodally to the diode and to a reference potential.

6. The circuit assembly of claim 4, further comprising:
a first watchdog voltage generating section, wherein:
a first first resistor is interconnected in series with a first capacitor and is connected to a reference voltage at a first of its ends and is connected to a first terminal of the first capacitor at a second of its ends;
a supply resistor, which is connected to a supply voltage at a first of its ends and is connected to a diode cathodally at a second of its ends, which diode provides the reference voltage between the first end of the first first resistor and a second terminal of the first capacitor; and
a first electronic switch having a first terminal, which is connected to the first terminal of the first capacitor and a first analog converter input of the microcontroller, a second terminal, which is connected to a first output of the microcontroller, and a third terminal, which is connected to the second terminal of the first capacitor, anodally to the diode and to a reference potential; and
a second watchdog voltage generating section, wherein:
a second first resistor is interconnected in series with a second capacitor and is connected to a reference voltage at a first of its ends and is connected to a first terminal of the second capacitor at a second of its ends,
the supply resistor, which is connected to a supply voltage at a first of its ends and is connected to a diode cathodally at a second of its ends, which diode provides the reference voltage between the first end of the first first resistor and the first end of the second first resistor and a second terminal of the first capacitor and of the second capacitor; and
a second electronic switch includes a first terminal, which is connected to the first terminal of the second capacitor and a second analog converter input of the microcontroller, a second terminal, which is connected to a second output of the microcontroller, and a third terminal, which is connected to the second terminal of the second capacitor and to a reference potential;

wherein the first watchdog voltage generating section and the second watchdog voltage generating section form a multi-channel watchdog circuit assembly.

7. The circuit assembly of claim 6, wherein the first watchdog voltage generating section and the second watchdog voltage generating section are driven and sampled in a phase-shifted manner such that one of the monitoring voltages is detected at one of the capacitors at a first predetermined time and is read in by the microcontroller, and another of the monitoring voltages is detected at another of the capacitors at a second predetermined time and is read in by the microcontroller.

8. The circuit assembly of claim 6, wherein a time constant of a timer determined by the first first resistor and the first capacitor and a time constant of a timer determined by the second first resistor and the second capacitor may differ from one another.

9. The circuit assembly of claim 3, wherein the electronic switch is embodied as a transistor.

10. The circuit assembly of claim 3, wherein the electronic switch is embodied in a manner integrated into the microcontroller.

11. The circuit assembly of claim 3, wherein the electronic switch is situated outside the microcontroller and is connected thereto.

12. The circuit assembly of claim 1, wherein samplings of a charging curve of a capacitor are repeated cyclically at defined sampling times.

13. The circuit assembly of claim 1, wherein the microcontroller is arranged to turn off an electronic switch until the complete charging of a capacitor, then to detect an absolute value of a reference voltage, and to calibrate at least one analog-to-digital converter channel of the microcontroller based on the detected value of the reference voltage.

14. A method for monitoring a microcontroller based on a watchdog voltage for monitoring a timing behavior of a microcontroller, the watchdog voltage being generated in a watchdog circuit assembly, the method comprising:

driving at least one watchdog voltage generating section for a temporally defined generation of at least one monitoring voltage, wherein the driving includes a defined discharging of a capacitor and then, beginning at a predetermined point in time, defined charging of the capacitor along a charging curve; and detecting and reading in the charging voltage of the capacitor, a charging voltage being generated at a predetermined sampling point in time, as the monitoring voltage;

wherein a monitoring voltage that is detected at the sampling point in time and lies within a predetermined voltage tolerance range indicates a fault-free state of the microcontroller, and a monitoring voltage that is detected at the predetermined point in time and lies outside the predetermined voltage tolerance range indicates a faulty state of the microcontroller, and wherein the watchdog circuit assembly includes a circuit assembly for monitoring the timing behavior of the microcontroller, including:

a microcontroller arranged to drive at least one watchdog voltage generating section for a temporally defined generation of at least one monitoring voltage and to detect and read in the then generated monitoring voltage at a predetermined sampling point in time;

wherein the at least one watchdog voltage generating section is arranged to generate the monitoring voltage that is detectable at a predetermined sampling point in time by sampling by the microcontroller, wherein a monitoring voltage that is detected at the sampling point in time and lies within a predetermined voltage tolerance range indicates a fault-free state of the microcontroller, and a monitoring voltage that is detected at the predetermined point in time and lies outside the predetermined voltage tolerance range indicates a faulty state of the microcontroller.

15. The method of claim 14, wherein, during a state of logic 0 of an output of the microcontroller, an electronic switch is turned off and the capacitor is chargeable in a defined manner, and, during a state of logic 1 of the output, the electronic switch is turned on and the capacitor is dischargeable in a defined manner.

16. The method of claim 15, wherein the capacitor is completely discharged at an arbitrary point in time, and is charged from the discharged state at a predetermined point in time, via the electronic switch in a manner controlled by the microcontroller, wherein a capacitor voltage and, at a subsequent sampling point in time, the monitoring voltage arise at the capacitor in accordance with the following equation defining a charging curve:

$$U(c/\!\!\!/_2) = U\text{Ref}^*(1-\exp(-t_{charge}/R^*C)$$

wherein Uc or U1 and/or U2 is the monitoring voltage that the microcontroller will read in at the sampling point in time after a known charging time starting from the predetermined point in time, URef is a highly stable reference voltage, the value of which is known precisely, $t_{charge}$ is the known charging time, and R/C defines an RC element comprising a resistor and the capacitor, which RC element defines a time constant $\tau = R^*C$ with which the capacitor is charged.

17. The method of claim 14, wherein the capacitor includes a plurality of capacitors, and wherein a first watchdog voltage generating section and a second watchdog voltage generating section are driven and sampled in a phase-shifted manner such that one of a plurality of monitoring voltages detected at one of the plurality of capacitors at a first predetermined time and is read in by the microcontroller, and another of the plurality of monitoring voltages is detected at another of the capacitors at a second predetermined time and is read in by the microcontroller.

18. The method of claim 14, wherein a time constant of an RC timer of a first watchdog voltage generating section and a time constant of an RC timer of a second watchdog voltage generating section differ from one another.

19. The method of claim 14, wherein the at least one watchdog voltage generating section generates monitoring voltages that are detectable at the predetermined sampling point in time by samplings by the microcontroller, and wherein samplings of the charging curve of the capacitor are repeated cyclically at defined sampling times.

20. The method of claim 14, wherein an electronic switch is turned off until complete charging of the capacitor, then a absolute value of a reference voltage is detected, and at least one analog-to-digital converter channel of the microcontroller is calibrated based on the detected value of the reference voltage.

* * * * *